United States Patent
Chen et al.

(10) Patent No.: US 11,146,204 B2
(45) Date of Patent: Oct. 12, 2021

(54) CIRCUIT FOR ACTIVELY PERFORMING SHORT-CIRCUIT AND MOTOR CONTROLLER

(71) Applicant: SUNGROW POWER SUPPLY CO., LTD., Anhui (CN)

(72) Inventors: Wenjie Chen, Anhui (CN); Anbo Yu, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 10 days.

(21) Appl. No.: 16/513,348

(22) Filed: Jul. 16, 2019

(65) Prior Publication Data
US 2020/0076347 A1  Mar. 5, 2020

(30) Foreign Application Priority Data

Aug. 29, 2018 (CN) .......................... 201810993191.4

(51) Int. Cl.
  *H02P 3/00* (2006.01)
  *H02P 29/024* (2016.01)
  *H02J 9/06* (2006.01)

(52) U.S. Cl.
  CPC .............. *H02P 29/024* (2013.01); *H02J 9/06* (2013.01)

(58) Field of Classification Search
  CPC .. B60L 15/2009; B60L 3/0046; B60L 3/0076; B60L 3/0092; B60L 7/003;
  (Continued)

(56) References Cited

U.S. PATENT DOCUMENTS 6,577,103 B2 * 6/2003 Tanaka .................. H02J 9/061
  307/66
6,841,983 B2 * 1/2005 Thomas ................ H02M 3/157
  323/322
(Continued)

FOREIGN PATENT DOCUMENTS

CN       1402418 A      3/2003
CN       102969918 A    3/2013
(Continued)

OTHER PUBLICATIONS

Extended European Search Report regarding Application No. 19187781.0 dated Jan. 7, 2020.
First Chinese Office Action regarding Application No. 201810993191.4 dated Nov. 29, 2019. English translation provided by Unitalen Attorneys at Law.

*Primary Examiner* — Kawing Chan
*Assistant Examiner* — Gabriel Agared
(74) *Attorney, Agent, or Firm* — Harness, Dickey & Pierce, P.L.C.

(57) ABSTRACT

A circuit for actively performing short-circuit and a motor controller are provided. The circuit includes an undervoltage detecting circuit, an emergency power supply, a reverse-flow preventing circuit, and a gate level selecting switch. The undervoltage detecting circuit is configured to detect a driving power supply signal outputted from the driving power supply and output, in a case that an amplitude of the driving power supply signal is lower than a first threshold, an emergency active short-circuit enable signal. In response to the emergency active short-circuit enable signal, the emergency power supply is enabled and the gate level selecting switch is controlled to switch from a first conduction path to a second conduction path, to transmit an emergency power supply signal outputted from the emergency power supply to a bridge arm via the second conduction path.

13 Claims, 7 Drawing Sheets

(58) Field of Classification Search
CPC .......... H02H 3/243; H02J 9/06; H02P 29/024; H02P 29/025; H02P 29/028; H02P 3/12; H02P 3/22; H03K 17/06
USPC ....................................................... 318/445
See application file for complete search history.

(56) References Cited

U.S. PATENT DOCUMENTS

| | | | |
|---|---|---|---|
| 9,948,219 B2 | 4/2018 | Saha et al. | |
| 2005/0253458 A1* | 11/2005 | Omae | H02J 7/1423 |
| | | | 307/10.1 |
| 2006/0226816 A1* | 10/2006 | Wai | H02M 3/158 |
| | | | 323/222 |
| 2010/0148733 A1* | 6/2010 | Koeppl | H02H 7/0844 |
| | | | 323/225 |
| 2016/0094024 A1 | 3/2016 | Chen et al. | |
| 2017/0331400 A1 | 11/2017 | Saha et al. | |

FOREIGN PATENT DOCUMENTS

| | | |
|---|---|---|
| CN | 204836744 U | 12/2015 |
| CN | 105514941 A | 4/2016 |
| CN | 205945026 U | 2/2017 |
| CN | 107148745 A | 9/2017 |
| JP | 2017118815 A | 6/2017 |

* cited by examiner

CIRCUIT FOR ACTIVELY PERFORMING SHORT-CIRCUIT AND MOTOR CONTROLLER

The present application claims priority to Chinese Patent Application No. 201810993191.4, titled "CIRCUIT FOR ACTIVELY PERFORMING SHORT-CIRCUIT AND MOTOR CONTROLLER", filed on Aug. 29, 2018 with the Chinese Patent Office, which is incorporated herein by reference in its entirety.

FIELD

The present disclosure relates to the technical field of security protection of motor controllers, and in particular to a circuit for actively performing short-circuit and a motor controller.

BACKGROUND

Motor controllers are widely used in the field of electric vehicles and the like. As shown in FIG. 1, a motor controller mainly functions to convert a direct current voltage supplied from a high-voltage battery into a three-phase alternating current voltage required by a motor, and drive the motor under the control of a Micro-controller, to provide a drive force or a braking torque to the vehicle.

Generally, the motor controller operates in an actively short-circuiting state for security. That is, the motor is controlled to have an output torque of approximate zero by the Micro-controller, such that no uncontrollable acceleration or deceleration of the vehicle is caused. Specifically, the motor controller performs control to simultaneously turn on three phases of lower bridge arms or three phases of upper bridge arms, to cause a three-phase stator winding of the motor to be short-circuited, thereby realizing the active short-circuit. In a case that the motor is actively short-circuited under the control of the motor controller, a current may be generated in the winding of the motor due to an induced electromotive force generated when the motor rotates, which flows through the turned on three phases of lower bridge arms (or the three phases of upper bridge arms). Since there is no electrical energy exchanged between the motor and the high-voltage battery as well as between the motor and a direct current side capacitor, only a small braking torque is generated in the motor, thereby ensuring operating security of the vehicle.

Reference is made to FIG. 2, which is a schematic structural diagram of a system for actively performing short-circuit in the conventional technology. In the system for actively performing short-circuit, a control circuit controls a three-phase lower bridge driving module, to realize a security state. However, in the system for actively performing short-circuit, a low-voltage power supply is required to supply power to the control circuit and a driving power supply. The control circuit and the driving power supply cannot operate once there is a fault (for example, a power loss) in the low-voltage power supply, thus the three phases of lower bridge arms and the three phases of upper bridge arms are all turned off, thus failing to ensure security.

Therefore, a technical problem to be solved urgently by those skilled in the art is how to provide a circuit for actively performing short-circuit and a motor controller, to improve the security of the motor controller.

SUMMARY

In view of this, a circuit for actively performing short-circuit and a motor controller including the same are provided according to the embodiments of the present discourse, to improve the security of a motor controller.

The circuit for actively performing short-circuit includes an undervoltage detecting circuit, an emergency power supply, a reverse-flow preventing circuit, and a gate level selecting switch. The undervoltage detecting circuit is connected to an external driving power supply, and is configured to detect a driving power supply signal outputted from the driving power supply and output, in a case that an amplitude of the driving power supply signal is lower than a first threshold, an emergency active short-circuit enable signal. The emergency power supply and the gate level selecting switch are connected to the undervoltage detecting circuit. In response to the emergency active short-circuit enable signal, the emergency power supply is enabled and the gate level selecting switch is controlled to switch from a first conduction path to a second conduction path, to transmit an emergency power supply signal outputted from the emergency power supply to a bridge arm via the second conduction path. The first conduction path is a path between the bridge arm and an external bridge arm driving circuit, and the second conduction path is a path between the bridge arm and the emergency power supply. The reverse-flow preventing circuit is arranged between the driving power supply and the emergency power supply, and is configured to insulate the driving power supply signal from the emergency power supply signal in a case that the emergency power supply is enabled.

In an embodiment, the undervoltage detecting circuit includes a stabilivolt, a first resistor, a first transistor, a second resistor, a second transistor, and a third resistor. A cathode of the stabilivolt is connected to both a first terminal of the second resistor and a first terminal of the third resistor, and serves as an input terminal of the undervoltage detecting circuit. An anode of the stabilivolt is connected to both a first terminal of the first resistor and a control terminal of the first transistor. A second terminal of the first resistor, an output terminal of the first transistor, and an output terminal of the second transistor are grounded. An input terminal of the first transistor is connected to both a second terminal of the second resistor and a control terminal of the second transistor. An input terminal of the second transistor is connected to a second terminal of the third resistor, and serves as an output terminal of the undervoltage detecting circuit.

In an embodiment, the emergency power supply is a direct current-to-direct current (DC-DC) converter having an enable port, and an input terminal of the emergency power supply is connected to an external direct current side capacitor.

In an embodiment, the undervoltage detecting circuit is further configured to output, in a case of outputting the emergency active short-circuit enable signal, an emergency pulse lockout signal to the bridge arm driving circuit, to disenable the bridge arm driving circuit from outputting any bridge arm driving signal to the gate level selecting switch.

In an embodiment, the reverse-flow preventing circuit includes a reverse-flow preventing diode. An anode of the reverse-flow preventing diode is connected to the driving power supply. A cathode of the reverse-flow preventing diode is connected to the emergency power supply.

In an embodiment, each of the first transistor and the second transistor is turned on in response to a signal at a high level.

In an embodiment, in a case that the emergency active short-circuit enable signal is at a high level, the gate level selecting switch is controlled to turn on the first conduction path. In a case that the emergency active short-circuit enable signal is at a low level, the gate level selecting switch is controlled to turn on the second conduction path.

The motor controller includes a low-voltage power supply, a driving power supply, a control circuit, a bridge arm driving circuit, a direct current side capacitor, a bridge arm and the circuit for actively performing short-circuit described above. The low-voltage power supply is connected to both the driving power supply and the control circuit, and is configured to supply power to the control circuit. The bridge arm driving circuit is connected to both the driving power supply and the control circuit, and is configured to output, in a case that an amplitude of a driving power supply signal outputted from the driving power supply is higher than a first threshold, a bridge arm driving signal in response to a bridge arm driving control signal outputted from the control circuit. The bridge arm driving signal is transmitted to the bridge arm via the first conduction path. The circuit for actively performing short-circuit is configured to transmit, in a case that the amplitude of the driving power supply signal outputted from the driving power supply is lower than the first threshold, an emergency power supply signal outputted from the emergency power supply to the bridge arm via the second conduction path.

In an embodiment, the undervoltage detecting circuit is further configured to output, in a case of outputting the emergency active short-circuit enable signal, an emergency pulse lockout signal to the bridge arm driving circuit, to disenable the bridge arm driving circuit from outputting any bridge arm driving signal.

In an embodiment, in a case that the emergency active short-circuit enable signal is at a high level, the gate level selecting switch is controlled to turn on the first conduction path. In a case that emergency active short-circuit enable signal is at a low level, the gate level selecting switch is controlled to turn on the second conduction path.

Based on the above technical solutions, a circuit for actively performing short-circuit is provided according to the present disclosure, which includes an undervoltage detecting circuit, an emergency power supply, a reverse-flow preventing circuit, and a gate level selecting switch. The undervoltage detecting circuit is configured to detect a driving power supply signal outputted from the driving power supply and output, in a case that an amplitude of the driving power supply signal is lower than a first threshold, an emergency active short-circuit enable signal. In response to the emergency active short-circuit enable signal, the emergency power supply is enabled and the gate level selecting switch is controlled to switch from a first conduction path to a second conduction path, to transmit an emergency power supply signal outputted from the emergency power supply to a bridge arm via the second conduction path. That is, in a case there is a fault in the driving power supply, the emergency power supply may be used to supply power to the bridge arm, thereby ensuring a normal drive of the bridge arm, thus ensuring the security of a vehicle.

In addition, in the circuit for actively performing short-circuit, a reverse-flow preventing circuit is further arranged between the driving power supply and the emergency power supply, thereby preventing erroneous detection of the undervoltage detecting circuit on the driving power supply signal which is pulled-up by the emergency power supply signal in a case that the emergency power supply is enabled.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. Apparently, the drawings in the following description show only embodiments of the present disclosure, and other drawings may be obtained by those skilled in the art from the drawings without making any creative work.

DETAILED DESCRIPTION OF EMBODIMENTS

Figure 1:
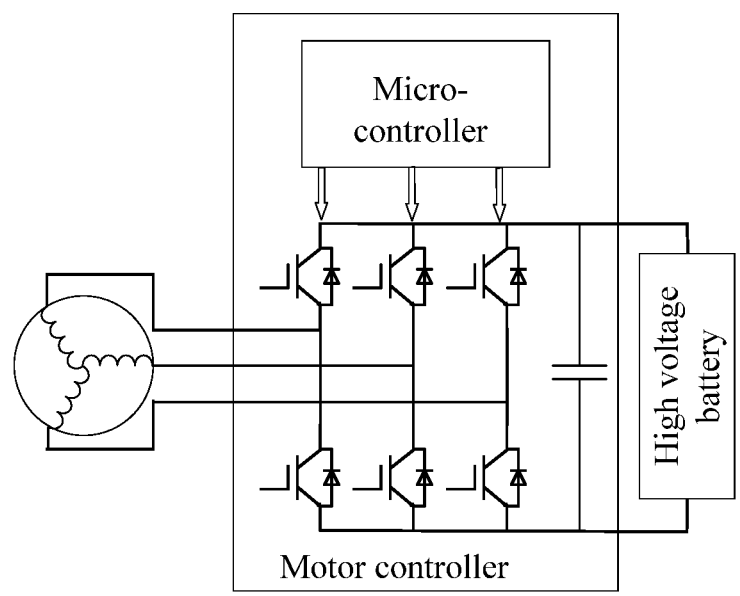
FIG. 1 is a schematic structural diagram showing a circuit for actively performing short-circuit in the conventional technology.
Figure 2:
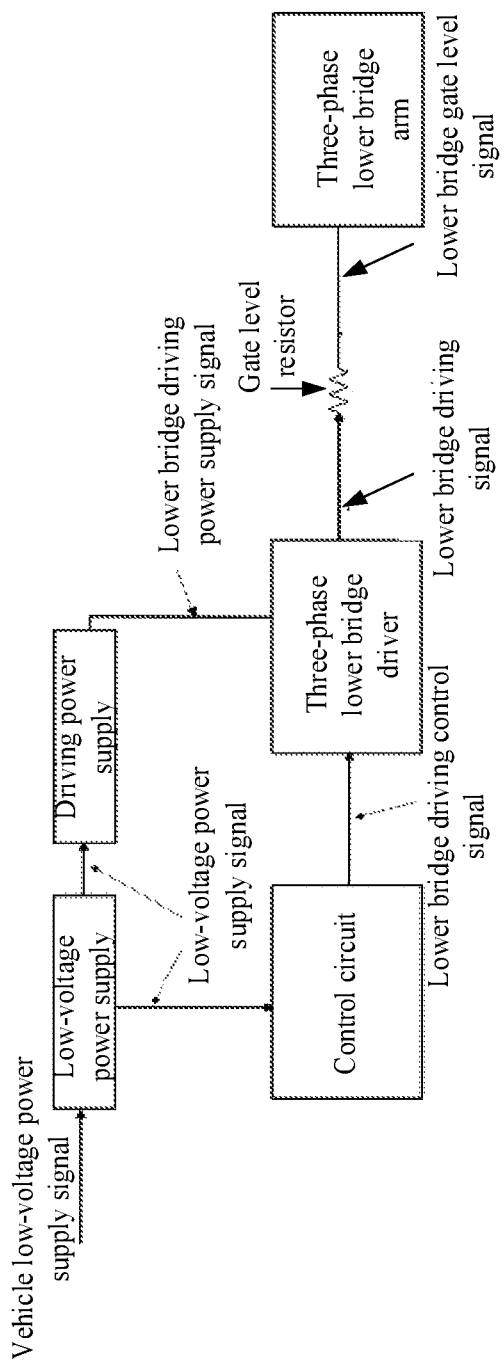
FIG. 2 is a schematic structural block diagram showing a motor controller in the conventional technology.

Referring to FIG. 2, in the system for actively performing short-circuit, a low-voltage power supply is required to supply power to the control circuit and a driving power supply. The control circuit and the driving power supply cannot operate once there is a fault (for example, a power loss) in the low-voltage power supply, thus the three phases of lower bridge arms and the three phases of upper bridge arms are all turned off, thereby failing to ensure security.

Figure 3:
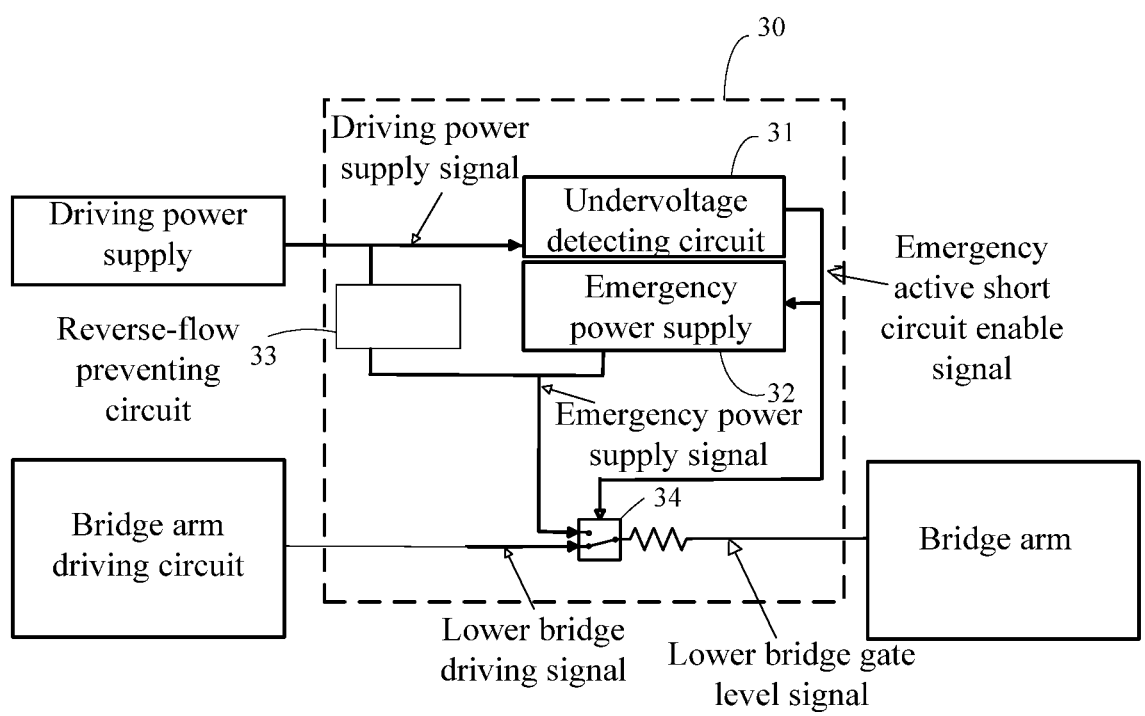
FIG. 3 is a schematic structural diagram showing a circuit for actively performing short-circuit according to an embodiment of the present disclosure.

Based on the above, reference is made to FIG. 3, which is a schematic structural diagram showing a circuit for actively performing short-circuit according to an embodiment of the present disclosure. In a case there is a fault in a low-voltage power supply, an emergency power supply may be used to supply power to a bridge arm driving circuit, thereby improving the security of a motor controller.

Specifically, a circuit for actively performing short-circuit 30 includes an undervoltage detecting circuit 31, an emergency power supply 32, a reverse-flow preventing circuit 33 and a gate level selecting switch 34.

The undervoltage detecting circuit 31 is connected to an external driving power supply, and is configured to detect a driving power supply signal outputted from the driving power supply and output, in a case that an amplitude of the driving power supply signal is lower than a first threshold, an emergency active short-circuit enable signal.

The emergency power supply 32 and the gate level selecting switch 34 are connected to the undervoltage detecting circuit 31. In response to the emergency active short-circuit enable signal, the emergency power supply 32 is enabled and the gate level selecting switch 34 is controlled to switch from a first conduction path to a second conduction path, to transmit an emergency power supply signal outputted from the emergency power supply 32 to a bridge arm via the second conduction path. The first conduction path is a path between the bridge arm and an external bridge arm driving circuit, and the second conduction path is a path between the bridge arm and the emergency power supply 32.

The reverse-flow preventing circuit 33 is arranged between the driving power supply and the emergency power supply 32, and is configured to insulate the driving power supply signal from the emergency power supply signal in a case that the emergency power supply 32 is enabled.

It can be seen from the above that, in this embodiment, in a case that a power failure occurs in the driving power supply due to a fault in a low-voltage power supply (for example, a power loss in the low-voltage power supply) or a fault in the driving power supply of a vehicle, the undervoltage detecting circuit detects that the driving power supply signal is at a low level, the undervoltage detecting circuit outputs an emergency active short-circuit enable signal in a case of determining that an amplitude of the driving power supply signal is lower than the first threshold, to enable the emergency power supply and control the gate level selecting switch to switch to another state, such that the emergency power supply is connected to the bridge arm. In this way, a lower bridge gate level signal changes following the emergency power supply signal, to control an upper bridge arm or a lower bridge arm to be turned on, thereby realizing the active short-circuit, thus ensuring the security of a vehicle.

It is to be noted that in this embodiment, the driving power supply may output one or more phases of driving power supply signals. For example, in a case that the bridge arm has a three-phase structure, the driving power supply may output three phases of driving power supply signals. The undervoltage detecting circuit is configured to detect each phase of the three phases of driving power supply signals, and output the emergency active short-circuit enable signal in a case of detecting that an amplitude of any one phase of the three phases of three-phase driving power supply signals is lower than the first threshold. Alternatively, the undervoltage detecting circuit is configured to output the emergency active short-circuit enable signal in a case of detecting that an amplitude of each phase of the three phases of driving power supply signals is lower than the first threshold.

In addition, in the circuit for actively performing short-circuit, a reverse-flow preventing circuit is further arranged between the driving power supply and the emergency power supply, thereby preventing erroneous detection of the undervoltage detecting circuit on the driving power supply signal which is pulled-up by the emergency power supply signal in a case that the emergency power supply is enabled.

Figure 4:
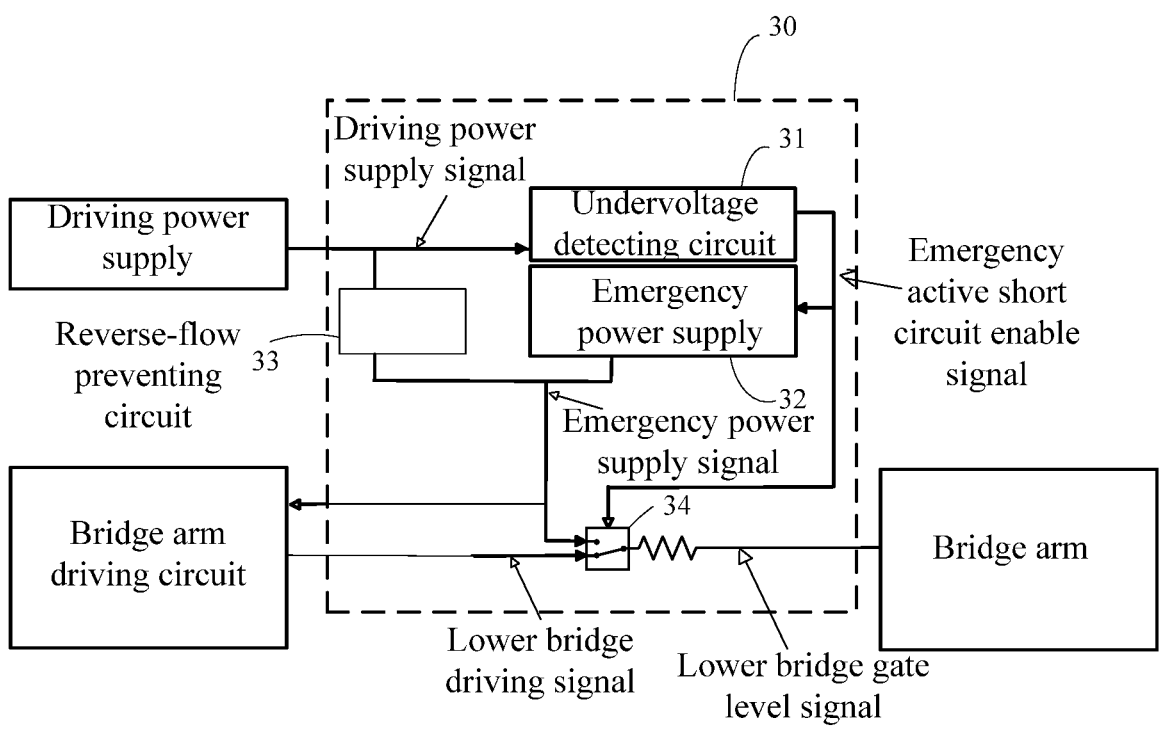
FIG. 4 is a schematic structural diagram showing a circuit for actively performing short-circuit according to another embodiment of the present disclosure.

Based on the above embodiment, in a circuit for actively performing short-circuit according to an embodiment of the present disclosure, as shown in FIG. 4, the undervoltage detecting circuit is further configured to output, in a case of outputting the emergency active short-circuit enable signal, an emergency pulse lockout signal to the bridge arm driving circuit, to disenable the bridge arm driving circuit from outputting any bridge arm driving signal to the gate level selecting switch.

Specifically, in a case that the amplitude of the driving power supply signal is lower than the first threshold, the undervoltage detecting circuit outputs the emergency pulse lockout signal to the bridge arm driving circuit, to lockout an upper bridge driving signal and a lower bridge driving signal. The emergency pulse lockout signal may be generated by a comparator, which is not described in detail herein.

Figure 5:
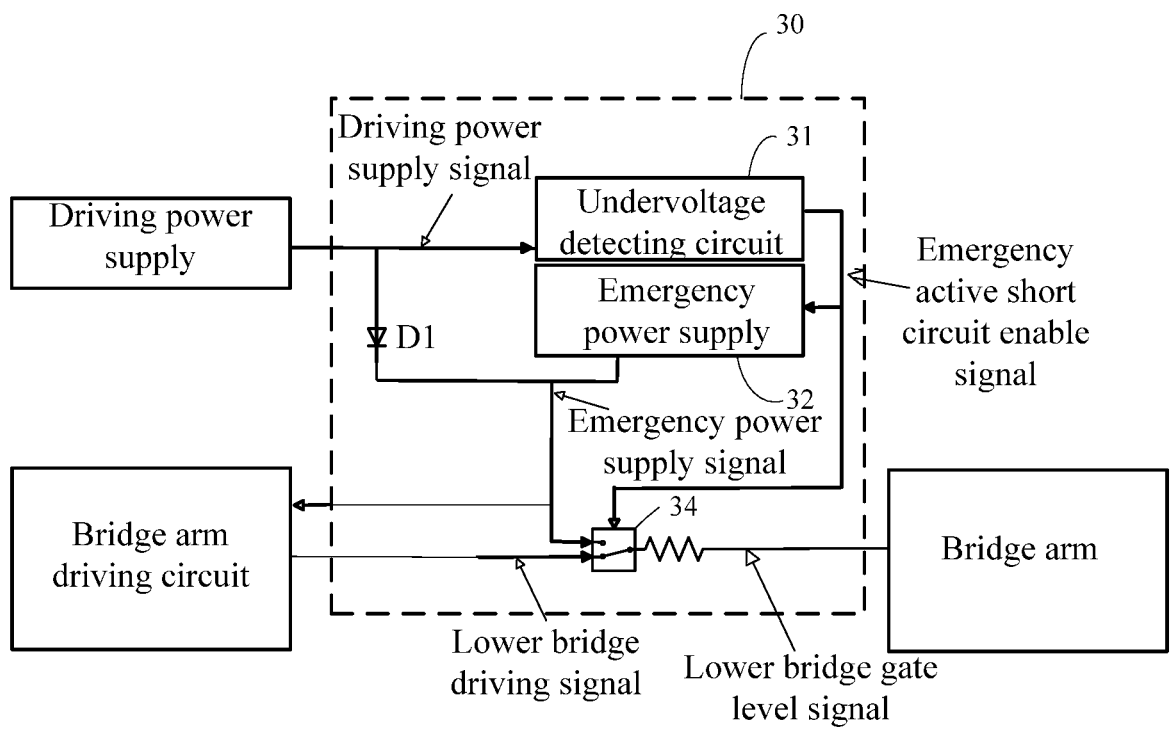
FIG. 5 is a schematic structural diagram showing a circuit for actively performing short-circuit according to another embodiment of the present disclosure.

In addition, in this embodiment, the reverse-flow preventing circuit may include a reverse-flow preventing diode D1. As shown in FIG. 5, an anode of the reverse-flow preventing diode is connected to the driving power supply, and a cathode of the reverse-flow preventing diode is connected to the emergency power supply. Further, the reverse-flow preventing circuit may be any circuit that has a reverse-flow preventing function, which is not described in detail herein.

Figure 6:
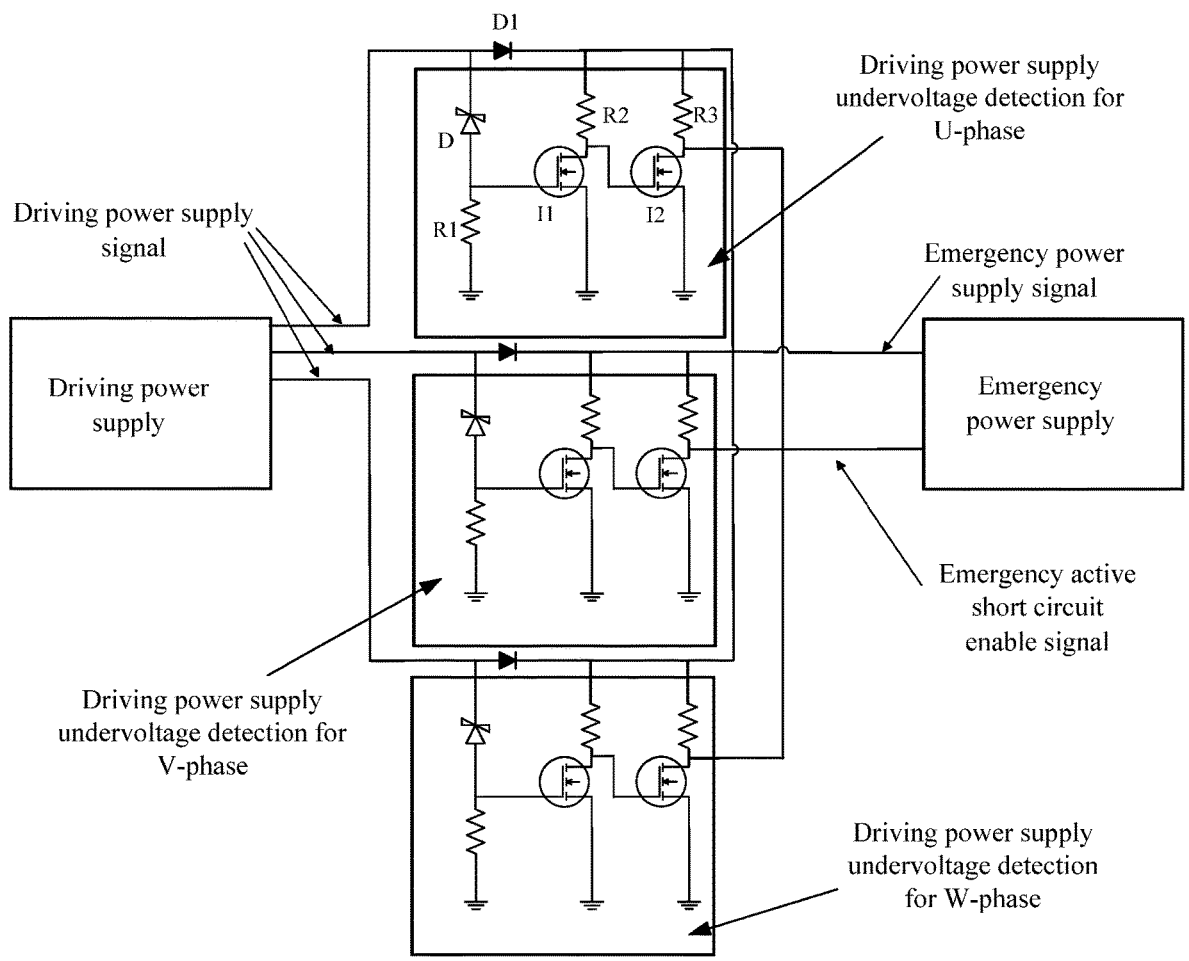
FIG. 6 is a schematic structural diagram showing a undervoltage detecting circuit in a circuit for actively performing short-circuit according to an embodiment of the present disclosure.

Further, a specific structure of an undervoltage detecting circuit is provided according to an embodiment of the present disclosure. The undervoltage detecting circuit may detect any one phase of driving power supply signals. As shown in FIG. 6, the undervoltage detecting circuit is configured to detect three phases of driving power supply signals. Hereinafter, the undervoltage detecting circuit is described by taking a U-phase driving power supply signal as an example. The undervoltage detecting circuit includes a stabilivolt D, a first resistor R1, a first transistor I1, a second resistor R2, a second transistor I2, and a third resistor R3, which are connected as follows.

A cathode of the stabilivolt is connected to both a first terminal of the second resistor and a first terminal of the third resistor, and serves as an input terminal of the undervoltage detecting circuit. An anode of the stabilivolt is connected to both a first terminal of the first resistor and a control terminal of the first transistor. A second terminal of the first resistor, an output terminal of the first transistor, and an output terminal of the second transistor are grounded. An input terminal of the first transistor is connected to both a second terminal of the second resistor and a control terminal of the second transistor. An input terminal of the second transistor is connected to a second terminal of the third resistor, and serves as an output terminal of the undervoltage detecting circuit.

With reference to the schematic structural diagram shown in FIG. 6, an operation principle of the undervoltage detecting circuit is described as follows.

The driving power supply signal is supplied to a cathode of the stabilivolt D. An anode of the stabilivolt is grounded via the first resistor R1 to form one branch, and the anode of the stabilivolt is further connected to a gate (that is, a control terminal) of the first transistor I1 to form another branch. A drain of the first transistor I1 is pulled up to the emergency power supply signal through the second resistor R2 to form one branch, and the drain of the first transistor I1 is further connected to a gate of the second transistor I2 to form another branch. An emergency active short-circuit enable signal is generated at a drain of the second transistor I2. In a case that the emergency active short-circuit enable signal is at a low level, it is indicated that the driving power supply is under voltage, the emergency power supply is enabled and the gate level selecting switch is controlled to turn on a second conduction path. In a case that the emergency active short-circuit enable signal is at a high level, it is indicated that the driving power supply is not under voltage, the emergency power supply is in a disenabled state.

The emergency active short-circuit enable signal is pulled up to have the same level as the emergency power supply signal through the third resistor R3. In a case that the driving power supply signal is higher than a breakdown voltage of the stabilivolt D, the stabilivolt D is turned on. In this case, a voltage at the gate of the first transistor I1 is at a high level, such that the first transistor I1 is turned on. A voltage at the gate of the second transistor I2 is at a low level, such that the second transistor I2 is turned off, thus the emergency active short-circuit enable signal is at a high level.

In a case that the driving power supply signal is lower than the breakdown voltage of the stabilivolt D, the stabilivolt D is turned off. The voltage at the gate of the first transistor I1 is at a low level, such that the first transistor I1 is turned off. The voltage at the gate of the second transistor I2 is at a high level, such that the second transistor I2 is turned on, thus the emergency active short-circuit enable signal is at a low level.

It is assumed that the breakdown voltage of the stabilivolt D is denoted by $V_Z$, and a conduction threshold of the first transistor I1 is denoted by $V_{Gth}$, an operation voltage (that is, a threshold $V_{TH}$ of the undervoltage detecting circuit) of the first transistor I1 may be expressed by: $V_{TH}=V_Z+V_{Gth}$.

In addition, operation principle of the undervoltage detecting circuit for the V-phase driving power supply signal and the W-phase driving power supply signal is the same as that for the U-phase driving power supply signal. Emergency active short-circuit enable signals outputted from the three phases of branches may be all inputted to one branch in a logical relationship of "AND". That is, in a case that the driving power supply is under voltage at any one phase, the emergency active short-circuit enable signal is outputted to enable the emergency power supply. Alternatively, a logic device may be arranged to form a logical relationship of "OR" among the emergency active short-circuit enable signals as needed. That is, the emergency active short-circuit enable signal is outputted only in a case that all of the three phases of bridge arms are under voltage.

Based on the above embodiments, a specific implementation of the emergency power supply and a specific implementation of the gate level selecting switch are further provided. The emergency power supply may be a linear power supply or a flyback power supply, for example, a direct current-to-direct current (DC-DC) converter having an enable port. An input terminal of the emergency power supply is connected to an external direct current side capacitor or another energy storage device. The emergency active short-circuit enable signal is transmitted to an enable port of the emergency power supply, to enable or disenable the emergency power supply.

In a case that the emergency active short-circuit enable signal is at a high level, the gate level selecting switch is controlled to turn on the first conduction path. In this case, the bridge arm is connected to an output terminal of the bridge arm driving circuit. A level of a bridge arm gate level signal is determined based on the bridge arm driving circuit. In a case that the emergency active short-circuit enable signal is at a low level, the gate level selecting switch is controlled to turn on the second conduction path. In this case, the bridge arm is connected to the emergency power supply. The bridge arm gate level signal is pulled-up by the driving power supply. The upper bridge arms or the lower bridge arms are turned on, to realize the active short-circuit.

Figure 7:
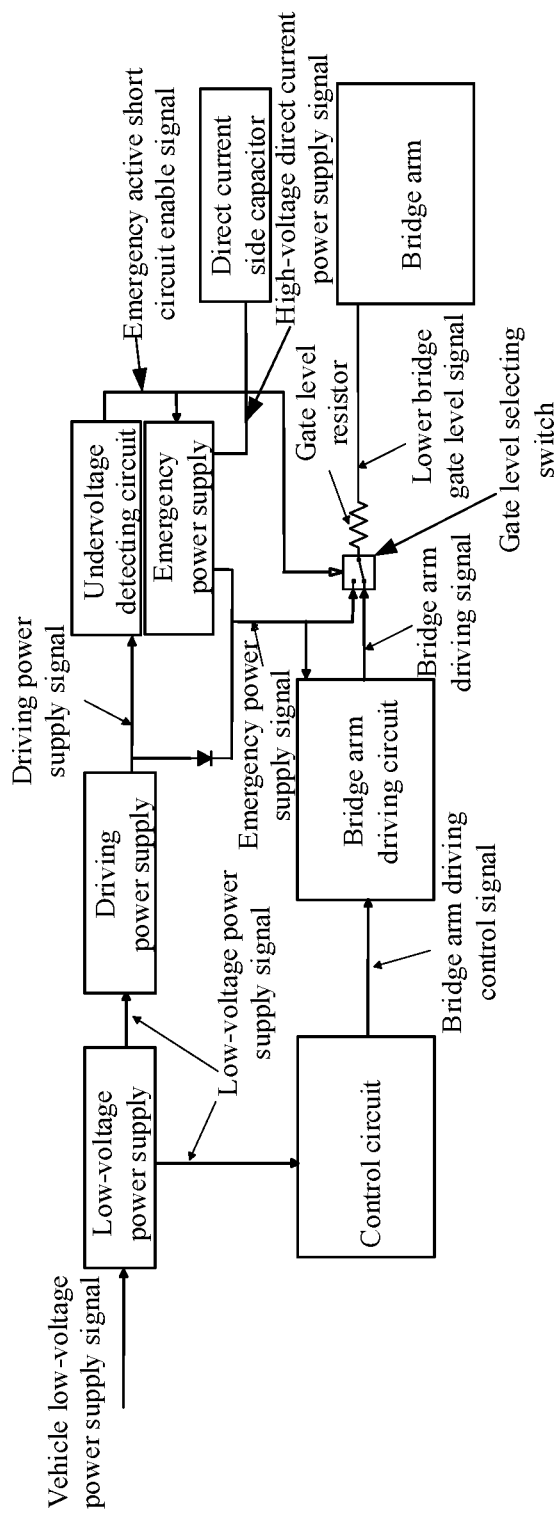
FIG. 7 is a schematic structural block diagram showing a motor controller according to an embodiment of the present disclosure.

Based on the above embodiments, a motor controller is further provided according to an embodiment of the present disclosure. As shown in FIG. 7, the motor controller includes a low-voltage power supply, a driving power supply, a control circuit, a bridge arm driving circuit, a direct current side capacitor, a bridge arm and the circuit for actively performing short-circuit described above.

The low-voltage power supply is connected to both the driving power supply and the control circuit, to supply power to the control circuit. The bridge arm driving circuit is connected to both the driving power supply and the control circuit. In a case that an amplitude of a driving power supply signal outputted from the driving power supply is higher than a first threshold, the bridge arm driving circuit is configured to output a bridge arm driving signal in response to a bridge arm driving control signal outputted from the control circuit. The bridge arm driving signal is transmitted to the bridge arm via the first conduction path. In a case that the amplitude of the driving power supply signal outputted from the driving power supply is lower than the first threshold, the circuit for actively performing short-circuit is configured to transmit an emergency power supply signal outputted from the emergency power supply to the bridge arm via the second conduction path.

For an operation principle of the motor controller, reference may be made to the operation principle of the circuit for actively performing short-circuit described above.

Based on the above embodiments, in the motor controller according to this embodiment, the undervoltage detecting circuit is further configured to output, in a case of outputting the emergency active short-circuit enable signal, an emergency pulse lockout signal to the bridge arm driving circuit, to disenable the bridge arm driving circuit from outputting any bridge arm driving signal.

In addition, with the motor controller in this embodiment, the gate level selecting switch is controlled to turn on the first conduction path in a case that the emergency active short-circuit enable signal is at a high level, and the gate level selecting switch is controlled to turn on the second conduction path in a case that the emergency active short-circuit enable signal is at a low level.

In summary, a circuit for actively performing short-circuit is provided according to the present disclosure, which includes an undervoltage detecting circuit, an emergency power supply, a reverse-flow preventing circuit, and a gate level selecting switch. The undervoltage detecting circuit is configured to detect a driving power supply signal outputted from the driving power supply and output, in a case that the amplitude of the driving power supply signal is lower than a first threshold, an emergency active short-circuit enable signal. In response to the emergency active short-circuit enable signal, the emergency power supply is enabled and the gate level selecting switch is controlled to switch from a first conduction path to a second conduction path, to transmit an emergency power supply signal outputted from the emergency power supply to a bridge arm via the second conduction path. That is, in a case there is a fault in the driving power supply, the emergency power supply may be used to supply power to the bridge arm, thereby ensuring a normal drive of the bridge arm, thus ensuring the security of a vehicle.

In addition, in the circuit for actively performing short-circuit, a reverse-flow preventing circuit is further arranged between the driving power supply and the emergency power supply, thereby preventing erroneous detection of the undervoltage detecting circuit on the driving power supply signal which is pulled-up by the emergency power supply signal in a case that the emergency power supply is enabled.

The embodiments in this specification are described in a progressive way, each of which emphasizes the differences from others, and the same or similar parts among the embodiments may be referred to each other. Since the motor controller disclosed in the embodiments corresponds to the disclosed circuit for actively performing short-circuit, the description thereof is relatively simple, and for relevant parts, references may be made to the description of the circuit for actively performing short-circuit.

It is to be further understood by those skilled in the art that units described in combination with the disclosed embodiments may be implemented by electronic hardware, computer software or a combination thereof. In order to clearly describe interchangeability of the hardware and the software, the units is generally described above based on functions. Whether the functions are realized by the hardware or the software is determined by specific applications of the technical solutions and design constraints. For each of the specific applications, those skilled in the art may adopt a specific implementation to realize the functions described above, and the implementation should fall within the scope of the present disclosure.

Functions of units described in combination with the disclosed embodiments may be directly performed by hardware, software modules that are executed by a processor, or a combination thereof. The software modules may be arranged in a random-access memory (ROM), an internal memory, a read-only memory (ROM), an electrically programmable random-access memory (EPROM), an electrically erasable programmable read-only memory (EEPROM), a register, a hard disk, a removable disk, a compact disc read-only memory (CD-ROM), or any one of other storage media that are known in this technical field.

With the description of the embodiments disclosed above, those skilled in the art may implement or use technical solutions of the present disclosure. Numerous modifications to the embodiments are apparent to those skilled in the art, and the general principles defined herein may be implemented in other embodiments without departing from the spirit or scope of the present disclosure. Therefore, the present disclosure may not be limited to the embodiments described herein, but should comply with the widest scope consistent with the principles and novel features disclosed herein.

The invention claimed is:

1. A circuit for actively performing short-circuit, comprising:
an undervoltage detecting circuit, wherein the undervoltage detecting circuit is connected to an external driving power supply, and is configured to detect a driving power supply signal outputted from the external driving power supply and output, in a case that an amplitude of the driving power supply signal is lower than a first threshold, an emergency active short-circuit enable signal;
an emergency power supply and an gate level selecting switch which are connected to the undervoltage detecting circuit, wherein in response to the emergency active short-circuit enable signal, the emergency power supply is enabled and the gate level selecting switch is controlled to switch from a first conduction path to a second conduction path, to transmit an emergency power supply signal outputted from the emergency power supply to a bridge arm via the second conduction path, and wherein the first conduction path is a path between the bridge arm and an external bridge arm driving circuit, and the second conduction path is a path between the bridge arm and the emergency power supply; and
a reverse-flow preventing circuit, wherein the reverse-flow preventing circuit is arranged between the external driving power supply and the emergency power supply, and is configured to insulate the driving power supply signal from the emergency power supply signal in a case that the emergency power supply is enabled,
wherein the undervoltage detecting circuit comprises a stabilivolt, a first resistor, a first transistor, a second resistor, a second transistor, and a third resistor, and wherein
a cathode of the stabilivolt is connected to both a first terminal of the second resistor and a first terminal of the third resistor, and serves as an input terminal of the undervoltage detecting circuit;
an anode of the stabilivolt is connected to both a first terminal of the first resistor and a control terminal of the first transistor;
a second terminal of the first resistor, an output terminal of the first transistor, and an output terminal of the second transistor are grounded;
an input terminal of the first transistor is connected to both a second terminal of the second resistor and a control terminal of the second transistor; and
an input terminal of the second transistor is connected to a second terminal of the third resistor, and serves as an output terminal of the undervoltage detecting circuit.

2. The circuit for actively performing short-circuit according to claim 1, wherein the emergency power supply is a direct current-to-direct current (DC-DC) converter having an enable port, and an input terminal of the emergency power supply is connected to an external direct current side capacitor.

3. The circuit for actively performing short-circuit according to claim 1, wherein the undervoltage detecting circuit is further configured to output, in a case of outputting the emergency active short-circuit enable signal, an emergency pulse lockout signal to the external bridge arm driving circuit, to disenable the external bridge arm driving circuit from outputting any bridge arm driving signal to the gate level selecting switch.

4. The circuit for actively performing short-circuit according to claim 1, wherein the reverse-flow preventing circuit comprises a reverse-flow preventing diode, an anode of the reverse-flow preventing diode is connected to the external driving power supply, and a cathode of the reverse-flow preventing diode is connected to the emergency power supply.

5. The circuit for actively performing short-circuit according to claim 1, wherein each of the first transistor and the second transistor is turned on in response to a signal at a high level.

6. The circuit for actively performing short-circuit according to claim 1, wherein
in a case that the emergency active short-circuit enable signal is at a high level, the gate level selecting switch is controlled to turn on the first conduction path; and
in a case that the emergency active short-circuit enable signal is at a low level, the gate level selecting switch is controlled to turn on the second conduction path.

7. A motor controller, comprising: a low-voltage power supply, a driving power supply, a control circuit, a bridge arm driving circuit, a direct current side capacitor, a bridge arm and a circuit for actively performing short-circuit, wherein
the circuit for actively performing short-circuit comprises:
an undervoltage detecting circuit, wherein the undervoltage detecting circuit is connected to the driving power supply, and is configured to detect a driving power supply signal outputted from the driving power supply and output, in a case that an amplitude of the driving power supply signal is lower than a first threshold, an emergency active short-circuit enable signal;
an emergency power supply and an gate level selecting switch which are connected to the undervoltage detecting circuit, wherein in response to the emergency active short-circuit enable signal, the emergency power supply is enabled and the gate level selecting switch is controlled to switch from a first conduction path to a second conduction path, to transmit an emergency power supply signal outputted from the emergency power supply to a bridge arm via the second conduction path, and wherein the first conduction path is a path between the bridge arm and the bridge arm driving circuit, and the second conduction path is a path between the bridge arm and the emergency power supply; and a reverse-flow preventing circuit, wherein the reverse-flow preventing circuit is arranged between the driving power supply and the emergency power supply, and is configured to insulate the driving power supply signal from the emergency power supply signal in a case that the emergency power supply is enabled, and wherein the low-voltage power supply is connected to both the driving power supply and the control circuit, and is configured to supply power to the control circuit;

the bridge arm driving circuit is connected to both the driving power supply and the control circuit, and is configured to output, in a case that an amplitude of the driving power supply signal outputted from the driving power supply is higher than a first threshold, a bridge arm driving signal in response to a bridge arm driving control signal outputted from the control circuit, wherein the bridge arm driving signal is transmitted to the bridge arm via the first conduction path; and the circuit for actively performing short-circuit is configured to transmit, in a case that the amplitude of the driving power supply signal outputted from the driving power supply is lower than the first threshold, an emergency power supply signal outputted from the emergency power supply to the bridge arm via the second conduction path.

8. The motor controller according to claim 7, wherein the undervoltage detecting circuit is further configured to output, in a case of outputting the emergency active short-circuit enable signal, an emergency pulse lockout signal to the bridge arm driving circuit, to disenable the bridge arm driving circuit from outputting any bridge arm driving signal.

9. The motor controller according to claim 7, wherein
in a case that the emergency active short-circuit enable signal is at a high level, the gate level selecting switch is controlled to turn on the first conduction path; and
in a case that the emergency active short-circuit enable signal is at a low level, the gate level selecting switch is controlled to turn on the second conduction path.

10. The motor controller according to claim 7, wherein the undervoltage detecting circuit comprises a stabilivolt, a first resistor, a first transistor, a second resistor, a second transistor, and a third resistor, and wherein
a cathode of the stabilivolt is connected to both a first terminal of the second resistor and a first terminal of the third resistor, and serves as an input terminal of the undervoltage detecting circuit;
an anode of the stabilivolt is connected to both a first terminal of the first resistor and a control terminal of the first transistor;
a second terminal of the first resistor, an output terminal of the first transistor, and an output terminal of the second transistor are grounded;
an input terminal of the first transistor is connected to both a second terminal of the second resistor and a control terminal of the second transistor; and
an input terminal of the second transistor is connected to a second terminal of the third resistor, and serves as an output terminal of the undervoltage detecting circuit.

11. The motor controller according to claim 7, wherein the emergency power supply is a direct current-to-direct current (DC-DC) converter having an enable port, and an input terminal of the emergency power supply is connected to the direct current side capacitor.

12. The motor controller according to claim 7, wherein the reverse-flow preventing circuit comprises a reverse-flow preventing diode, an anode of the reverse-flow preventing diode is connected to the driving power supply, and a cathode of the reverse-flow preventing diode is connected to the emergency power supply.

13. The motor controller according to claim 10, wherein each of the first transistor and the second transistor is turned on in response to a signal at a high level.

* * * * *